United States Patent
Taguwa et al.

[11] Patent Number: 6,107,190
[45] Date of Patent: Aug. 22, 2000

[54] METHOD OF FABRICATING SEMICONDUCTOR DEVICE

[75] Inventors: Tetsuya Taguwa; Yoshiaki Yamada, both of Tokyo, Japan

[73] Assignee: NEC Corporation, Tokyo, Japan

[21] Appl. No.: 08/959,268

[22] Filed: Oct. 28, 1997

[30] Foreign Application Priority Data

Jan. 30, 1997 [JP] Japan ................................. 9-016191

[51] Int. Cl.⁷ .................... H01L 21/441; H01L 21/4763; H01L 23/52; H01L 29/40

[52] U.S. Cl. .................... 438/637; 438/643; 438/644; 438/645; 438/648; 438/652; 438/653; 438/654; 438/656; 257/748; 257/751; 257/752; 257/753; 257/758; 257/763; 257/764; 257/770

[58] Field of Search .................... 438/637, 643, 438/627, 629, 305, 625, 648; 430/313, 271; 257/165, 757, 437; 216/68; 204/192

[56] References Cited

U.S. PATENT DOCUMENTS

| | | | |
|---|---|---|---|
| 4,820,611 | 4/1989 | Arnold, III et al. | 430/271 |
| 5,286,608 | 2/1994 | Koh | 430/313 |
| 5,306,952 | 4/1994 | Matsuura et al. | 257/165 |
| 5,399,237 | 3/1995 | Keswick et al. | 216/68 |
| 5,534,730 | 7/1996 | Mori et al. | 257/757 |
| 5,540,820 | 7/1996 | Terakado et al. | 204/192.3 |
| 5,571,751 | 11/1996 | Chung | 438/625 |
| 5,573,978 | 11/1996 | Cho | 438/643 |
| 5,627,102 | 5/1997 | Shinriki et al. | 438/648 |
| 5,744,395 | 4/1998 | Shue et al. | 438/305 |
| 5,759,915 | 6/1998 | Matsunaga et al. | 438/627 |
| 5,783,485 | 7/1998 | Ong et al. | 438/637 |
| 5,841,179 | 11/1998 | Pramanick et al. | 257/437 |
| 5,882,999 | 3/1999 | Anderson et al. | 438/629 |

OTHER PUBLICATIONS

Joseph Hillman et al., Solid State Technology, *Integrated CVD Titanium and Titanium Nitride Processes for Sub–0.5–μm Metallization*, Jul. 1995, pp. 147, 148, 150, and 152.

*Primary Examiner*—Tom Thomas
*Assistant Examiner*—Bernard E. Souw
*Attorney, Agent, or Firm*—Young & Thompson

[57] ABSTRACT

There is provided a method of fabricating a semiconductor including the steps, in this order, of (a) forming an interlayer insulating film on a semiconductor substrate, (b) forming a first TiN film on the interlayer insulating film by sputtering, (c) forming a hole throughout the interlayer insulating film to thereby cause the semiconductor substrate to appear, (d) forming a second TiN film over the first TiN film by chemical vapor deposition to thereby fill the hole with the second TiN film, and (e) removing the first and second TiN films except TiN filling the hole therewith. When a Ti or TiN film having a thickness sufficient to fill a contact hole or a through-hole therewith is to be formed by CVD even at low temperature, the this method prevents the Ti or TiN film from being cracked or peeled off.

21 Claims, 8 Drawing Sheets

METHOD OF FABRICATING SEMICONDUCTOR DEVICE

BACKGROUND OF THE INVENTION

1. Field of the Invention

The invention relates to a method of fabricating a semiconductor device, and more particularly to such a method including a step of filling a contact hole and/or a through-hole formed throughout an interlayer insulating film with TiN and/or Ti films formed by chemical vapor deposition.

2. Description of the Related Art

With integration in LSI becoming higher and higher, a contact hole has been formed smaller and smaller in a diameter, resulting in that an aspect ratio defined by a depth divided by a diameter of a contact hole becomes greater and greater. Thus, since metal such as aluminum formed by sputtering, which has been conventionally employed, has poor step coverage, a connection resistance has become greater, and disconnection between upper and lower wiring layers has often happened. Even if upper and lower wiring layers could be electrically connected with each other through a contact hole filled with aluminum, there is a problem of poor reliability that disconnection often happens between the wiring layers because of electromigration, namely a phenomenon where aluminum atoms are moved by a current running through aluminum.

As a solution to this problem, a contact hole has been filled with metal. A typical solution is a so-called tungsten plug method by which a contact hole is filled with tungsten formed by chemical vapor deposition (hereinafter, referred to simply as "CVD") which has excellent step coverage. The tungsten plug method includes the steps of forming a barrier metal film by sputtering, filling a contact hole with tungsten by CVD, and etching back tungsten to allow tungsten to remain only in the contact hole to thereby form a tungsten plug. Herein, the barrier metal is composed of titanium (Ti) for lowering a connection resistance of a contact hole or a contact resistance, and a titanium nitride (TiN) for increasing adhesion between a contact hole and tungsten to thereby prevent tungsten from penetrating a substrate.

However, as a contact hole has been formed smaller and smaller in a diameter with an aspect ratio becoming higher and higher, it has become impossible to form a titanium or titanium nitride film to have a desired thickness in a contact hole even in accordance with sputtering in the above-mentioned tungsten plug method, resulting in problems that a contact resistance is increased, and that a device may be destroyed by tungsten.

Hence, many attempts have been made to form by CVD, a titanium or titanium nitride film having excellent step coverage. However, three layers, namely a titanium layer, a titanium nitride layer, and a tungsten layer have to be formed by CVD in such attempts, resulting in problems that fabricating steps become complicated, and that fabrication costs are unavoidable increased.

As a solution to these problems, there has been suggested a method in which a contact hole is filled with titanium nitride or titanium by CVD having excellent step coverage, to thereby omit a step of forming a tungsten film.

FIGS. 1A to 1D illustrates the suggested method including the step of filling a contact hole with titanium nitride. First, an interlayer insulating film 82 is formed by CVD on a silicon substrate 81 on which devices are fabricated. Herein, the interlayer insulating film 82 is made of a boron phospho silicate glass (BPSG) film comprising a silicon dioxide film into which phosphorus (P) and boron (B) are added. Then, as illustrated in FIG. 1A, a contact hole 80 is formed by conventional photolithography and dry etching so that the contact hole 80 reaches the silicon substrate 81. The contact hole 80 is designed to have a diameter of about 0.4 $\mu$m.

Then, a titanium (Ti) film 83 is deposited over the BPSG film 82 by plasma-enhanced CVD by a thickness in the range of 10 nm to 50 nm. Subsequently, a titanium nitride (TiN) film 84 is deposited over the Ti film 83 by thermal CVD by a thickness of about 0.3 $\mu$m. Thus, as illustrated in FIG. 1B, the contact hole 80 is completely filled with the Ti film 83 and the TiN film 84.

Then, the Ti film 83 and the TiN film 84 situated above the BPSG film 82 are removed by dry etching using chlorine ($Cl_2$) gas. Thus, the Ti film 83 and the TiN film 84 remains only in the contact hole 80, as illustrated in FIG. 1C.

Then, an aluminum alloy film 85 is deposited over the BPSG film 82 by sputtering, and then patterned in a desired pattern by conventional photolithography and dry etching. Thus, as illustrated in FIG. 1D, an aluminum wiring layer is formed.

The method of filling a contact hole with a TiN film formed by CVD has been suggested, for instance, in Japanese Unexamined Patent Publications Nos. 5-94965, 5-94969 and 5-136085.

Though the above-mentioned method has suggested only a method of filling a contact hole with a TiN film, it is considered that a contact hole could be filled with a Ti film formed by CVD in accordance with almost the same method as the above-mentioned one.

In accordance with the above-mentioned conventional method of fabricating a semiconductor method, if a TiN film was formed thick to fill a contact hole therewith by CVD, there would arise a problem that the TiN film may be cracked or peeled off, because a tensile stress equal to or greater than $10^{10}$ dyne/cm$^2$ acts on the TiN film having been formed by CVD, and the TiN film has poor adhesion with a silicon dioxide film. If the TiN film was peeled off, the underlying interlayer insulating film or BPSG film was improperly etched in a subsequent step of etching the TiN film, resulting in reduction in fabrication yield and reduction in reliability. In addition, the peeled-off TiN film acts as a debris, which also causes reduction in fabrication yield. When the TiN film was cracked, there would also arise a problem that the underlying BPSG film would be improperly etched.

When a contact hole is to be filled with a Ti film formed by CVD, there would arise the same problems as those for a TiN film. Namely, a Ti film can be peeled off or cracked.

It is quite important for ULSI such as DRAM to have a greater cell capacity as well as to have a higher aspect ratio for a contact hole. In order to ensure a higher capacity, a method of reducing a thickness of an oxide film in equivalence of a thickness of a capacitive insulating film is now being developed. Among oxide films, a tantalum oxide ($Ta_2O_5$) film is considered promising as material a film made of which is capable of reducing a thickness thereof in comparison with a SiN film.

However, in this method, after a ultra-thin $Ta_2O_5$ film has been once formed, it is not allowed to apply a heat treatment at 500° C. or higher to a semiconductor device in order to protect a current leakage characteristic. Hence, a Ti or TiN film for filling a contact hole or a through-hole therewith is required to be formed by CVD at substrate temperature equal to or smaller than 500° C. However, it would be quite difficult or almost impossible to have sufficient adhesion between a Ti or TiN film and a through- or contact hole at such low substrate temperature, which would make more serious a problem that a Ti or TiN film is cracked or peeled off on an interlayer insulating or BPSG film. A Ti or TiN film is cracked or peeled off often particularly in a wide area where no patterns are formed.

Another method of forming a Ti or TiN film by CVD has been suggested in "Integrated CVE titanium and titanium nitride processes for sub-0.5- μm metallization" by Joseph Hillman et al., Solid State Technology, July 1995, pp. 147–152. The suggested CVD-Ti and CVD-TiN processes with an existing CVD-tungsten (W) process provides a high-quality metallization module for devices with high-aspect-ratio features at a low cost relative to collimated sputtering.

SUMMARY OF THE INVENTION

In view of the foregoing problems of the conventional methods, it is an object of the present invention to provide a method of fabricating a semiconductor device which method is capable of forming a Ti and/or TiN film having a thickness sufficient to fill a contact hole or a through-hole therewith by CVD without the Ti and/or TiN film being cracked or peeled off, even when the Ti and/or TiN film have been formed at low temperature, thereby enhancing fabrication yield and reliability.

The above-mentioned object can be accomplished by forming a TiN and/or Ti film on an interlayer insulating film by sputtering either before or after a contact hole or a through-hole is formed throughout the interlayer insulating film. Specifically, the invention provides a method as follows.

There is provided a method of fabricating a semiconductor including the steps of (a) forming an interlayer insulating film on a semiconductor substrate, (b) forming a first TiN film on the interlayer insulating film by sputtering, (c) forming a hole throughout the interlayer insulating film to thereby cause the semiconductor substrate to appear, (d) forming a second TiN film over the first TiN film by chemical vapor deposition to thereby fill the hole with the second TiN film, and (e) removing the first and second TiN films except TiN filling the hole therewith, the steps (a) to (e) being carried out in this order.

In the above-mentioned method, the step (c) may be carried out prior to the step (b). An electrically conductive layer may be formed on the semiconductor substrate, in which case the hole is formed to cause the electrically conductive layer to appear in the step (c). For instance, at least a surface of the electrically conductive layer is made of one of refractory metal, refractory metal alloy, refractory metal silicide, refractory metal nitride, and low-resistive metal.

It is preferable that the sputtering is carried out in the step (b) so that compressive stress is generated in the first TiN film.

It is preferable that the first TiN film has a thickness in the range of 25 nm to 50 nm both inclusive, and that the second TiN film has a thickness in the range of 0.2 μm to 0.3 μm both inclusive.

The method may further include the step of (f) forming a wiring layer on the interlayer insulating film, the step (f) being carried out subsequently to the step (e). As an alternative, the first and second TiN films are etched in a selected area in the step (e) to thereby form a capacitive lower electrode or a wiring layer composed of the first and second TiN films. The second TiN film can be formed in the step (d) at a temperature equal to or below 500° C.

There is further provided a method of fabricating a semiconductor including the steps of (a) forming an interlayer insulating film on a semiconductor substrate, (b) forming a first TiN film on the interlayer insulating film by sputtering, (c) forming a hole throughout the interlayer insulating film to thereby cause the semiconductor substrate to appear, (d) forming a Ti film all over a resultant by chemical vapor deposition, (e) forming a second TiN film all over a resultant by chemical vapor deposition to thereby fill the hole with the second TiN film, and (f) removing the first and second TiN films except TiN filling the hole therewith, the steps (a) to (f) being carried out in this order.

The first Ti film may have a thickness in the range of 5 nm to 50 nm both inclusive. It is preferable that the second Ti film is formed in the step (d) by reducing $TiCl_4$.

There is still further provided a method of fabricating a semiconductor including the steps of (a) forming an interlayer insulating film on a semiconductor substrate, (b) forming a first Ti film on the interlayer insulating film by sputtering, (c) forming a hole throughout the interlayer insulating film to thereby cause the semiconductor substrate to appear, (d) forming a second Ti film all over a resultant by chemical vapor deposition to thereby fill the hole with the second Ti film, and (e) removing the first and second Ti films except Ti filling the hole therewith, the steps (a) to (e) being carried out in this order.

There is yet further provided a method of fabricating a semiconductor including the steps of (a) forming an interlayer insulating film on a semiconductor substrate, (b) forming a first Ti film on the interlayer insulating film by sputtering, (c) forming a hole throughout the interlayer insulating film to thereby cause the semiconductor substrate to appear, (d) forming a second Ti film and a TiN film all over a resultant by chemical vapor deposition to thereby fill the hole with the second Ti film and the TiN film, and (e) removing the first and second Ti films and the TiN film except Ti and TiN filling the hole therewith, the steps (a) to (e) being carried out in this order.

In accordance with the above-mentioned method, the Ti and/or TiN film is(are) formed by CVD on the first TiN film and/or the Ti film formed by sputtering above an interlayer insulating film. Since the TiN film formed by sputtering can produce a compressive stress therein, a tensile stress produced in the TiN film formed by CVD can be released.

In addition, the TiN and Ti films formed by sputtering have excellent adhesion with an interlayer insulating film, it is possible to prevent the TiN and Ti films from being cracked or peeled off, even when the CVD-TiN film is formed thick or when the CVD-Ti film is formed at low temperature.

When the Ti film is formed under the TiN layer, it would be possible to form a Ti film at a bottom of a contact hole which film has a thickness sufficient to lower a contact resistance, because a TiN film formed by CVD has excellent step coverage. In addition, since a through- or contact hole can be filled with a CVD-TiN film which is lower resistive than a TiN film formed by sputtering, it would be possible to lower a resistance of a through- or contact hole.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

Figure 1A:
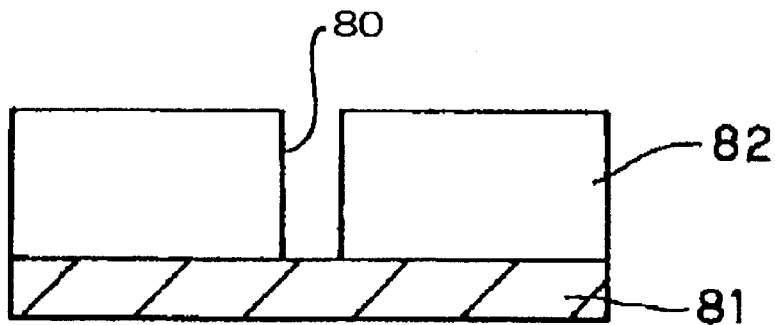
FIGS. 1A to 1D are cross-sectional views of a semiconductor device, illustrating respective steps of a conventional method of fabricating a semiconductor device.
Figure 1B:
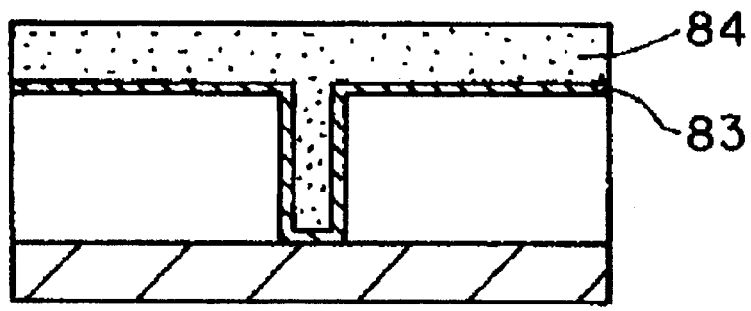
Figure 1C:
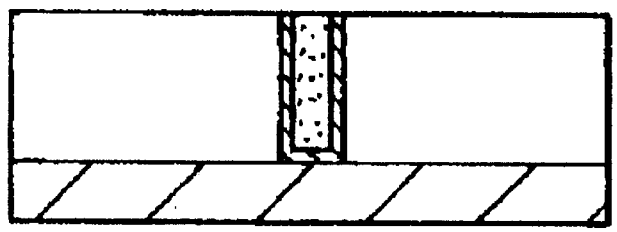
Figure 1D:
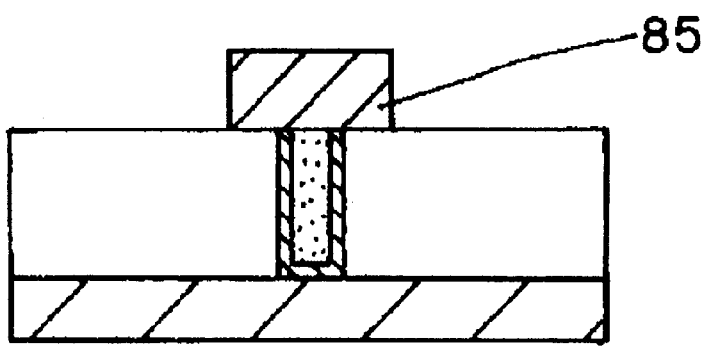
Figure 2A:
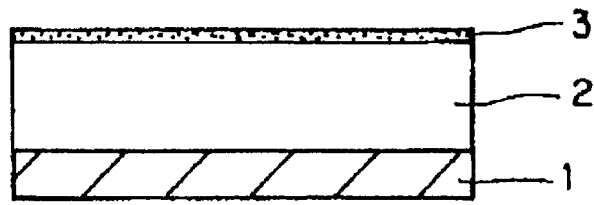
FIGS. 2A to 2E are cross-sectional views of a semiconductor device, illustrating respective steps of a method of fabricating a semiconductor device, in accordance with the first embodiment of the invention.

FIGS. 2A to 2E illustrate a method of fabricating a semiconductor device in accordance with the first embodiment of the invention. A boron phospho silicate glass (BPSG) film 2 as an interlayer insulating film is formed on a silicon substrate 1, on which devices have been fabricated, by CVD by a thickness of about 1.5 μm. Then, a first TiN film 3 is formed by sputtering by a thickness in the range of 25 to 50 nm, as illustrated in FIG. 2A. The first TiN film 3 may be formed after a later mentioned contact hole has been formed throughout the BPSG film 2.

Figure 2B:
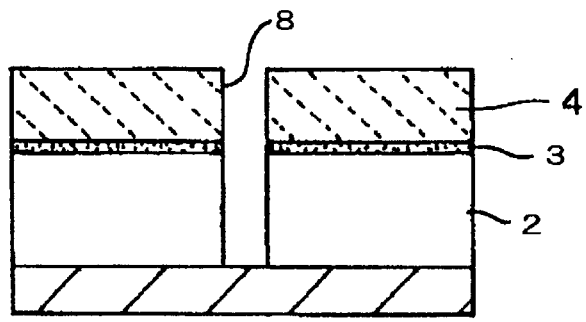

Then, after a photoresist film 4 has been applied over the first TiN film 3, there is formed an about 0.3 μm-diameter hole at a desired location throughout the photoresist film 4 by exposure and development. Then, the first TiN film 3 is dry etched by employing the photoresist film 4 as a mask with chlorine ($Cl_2$) and boron trichloride ($BCl_3$) gases employed as process gases. Then, the BPSG film 2 is dry etched by using a mixture gas of trifluorochloromethane ($CHF_3$) and carbon monoxide (CO) gases, until the silicon substrate 1 appears. Thus, a contact hole 8 is formed throughout the photoresist film 4, first TiN film 3, and BPSG film 2, as illustrated in FIG. 2B.

Figure 2C:
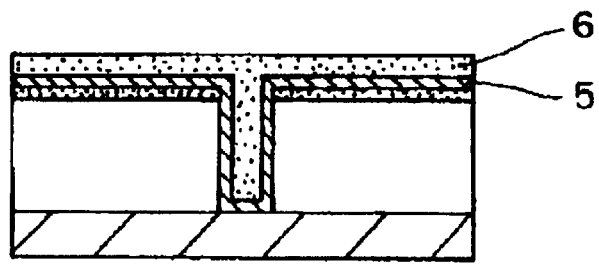

After the photoresist film 4 has been removed, a Ti film 5 and a second TiN film 6 are in turn formed over a resultant by CVD to thereby fill the contact hole 8 with the Ti film 5 and the second TiN film 6, as illustrated in FIG. 2C. The Ti film 5 is formed by a thickness in the range of 10 to 30 nm by plasma-enhanced CVD under the following conditions.

$TiCl_4$ flow rate: 3 to 10 sccm

Ar flow rate: 200 to 500 sccm $H_2$ flow rate: 1000 to 2000 sccm

Pressure: 3 to 10 Torr.

Substrate Temperature: 500 to 600° C.

RF power applied to opposing electrodes of a substrate: multiple hundreds W

The second TiN film 6 is formed by a thickness in the range of 0.2 to 0.3 μm by thermal CVD under the following conditions.

$TiCl_4$ flow rate: 30 to 50 sccm $NH_3$ flow rate: 40 to 70 sccm $N_2$ flow rate: 2000 to 4000 sccm Pressure: 15 to 30 Torr.

Substrate Temperature: 450 to 550° C.

If a thin film which will be deteriorated in film quality if exposed to high temperature, such as $Ta_2O_5$ film, has already been formed, the Ti film 5 and the second TiN film 6 may be formed at temperature equal to or below 500° C.

Figure 2D:
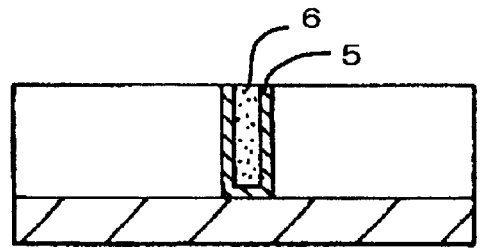

Then, a resultant is etched by using chlorine ($Cl_2$) gas to thereby remove the second TiN film 6, the Ti film 5, and the first TiN film 3 situated higher than an upper surface of the BPSG film 2. Thus, an upper surface of the BPSG film 2 appears, and only the contact hole 8 is filled with the second TiN film 6 and the Ti film 5, as illustrated in FIG. 2D.

Figure 2E:
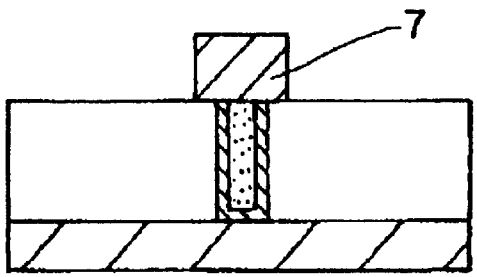

Then, an aluminum alloy film 7 is deposited by sputtering by a thickness in the range of 0.3 to 1.0 μm. The thus deposited aluminum alloy film 7 is patterned into a desired pattern by conventional photolithography and dry etching. Thus, an aluminum wiring layer is completed, as illustrated in FIG. 2E.

The above-mentioned first embodiment presents advantages as follows.

Since the first TiN film 3 is formed by sputtering, the first TiN film 3 has more excellent adhesion with the BPSG film 2 as an interlayer insulating film than a TiN film formed by CVD, and it is possible to form the first TiN film 3 so as to act a compressive stress thereon. Hence, adhesion of the second TiN film 6 to the BPSG film 2 is enhanced, and a high tensile stress generated in the second TiN film 6 having been formed by CVD is released, both of which ensure that the second TiN film 6 is not cracked and peeled off, even if the second TiN film 6 was formed thick. Accordingly, the contact hole 8 can be filled with the second TiN film 6 having excellent step coverage without the second TiN film 6 being cracked or peeled off.

It is preferable that the first TiN film 3 is formed so that a compressive stress is generated in the first TiN film 3 so as to relax a high tensile stress generated in the second TiN film 6. To this end, it is preferable that the first TiN film 3 is formed by sputtering at greater sputtering power and at lower pressure. It is also preferable that the sputtering is carried out at high temperature in order to prevent a compressive stress from changing to a tensile stress when the first TiN film 3 is heated.

If the first TiN film 3 was formed to have a thickness smaller than 25 nm, the effect of relaxing a tensile stress of the second TiN film 6 would be reduced, and the second TiN film 6 would be cracked or peeled off when the second TiN film 6 is formed to have a thickness equal to or greater than 150 nm. If the first TiN film 3 were formed too thick, the contact hole 8 would be deeper, which would make it difficult to fill the contact hole 8 with the films 5 and 6. Thus, it is preferable that the second TiN film 6 is formed to have a thickness equal to or smaller than 50 nm.

In the above-mentioned first embodiment, the contact hole 8 is filled only with the Ti film 5 and the second TiN film 6 both formed by CVD. In accordance with the above-mentioned first embodiment, a contact hole having a greater aspect ratio can be filled with the films 5 and 6. It is also possible to form a Ti film at a bottom of a contact hole which film has a thickness sufficient to reduce a connection resistance between the silicon substrate 1 and the Ti film. In addition, the TiN film formed by CVD has lower resistivity than a TiN film formed by sputtering. Specifically, the former has resistivity in the range of 70 to 80 $\mu\Omega$cm, whereas the latter has resistivity of about 100 $\mu\Omega$cm. Thus, it is possible to lower a resistance of the contact hole 8.

In the first embodiment, when the contact hole 8 is formed by photolithography, the first TiN film 3 has been formed under the photoresist film 4. Such a structure has been suggested in Japanese Unexamined Patent Publication No. 1-243550, for instance. The first TiN film 3 provides the following advantages.

If the first TiN film 3 is not formed, exposure lights make multiple interference with each other because of varied thicknesses of the BPSG film 2 to thereby cause a problem that the contact hole 8 is changed in size. However, by forming the first TiN film 3 between the photoresist film 4 and the BPSG film 2, exposure lights are well absorbed into the first TiN film 3. As a result, it is possible to avoid multiple interference of exposure lights, ensuring that contact holes can be uniformly formed at an intended size.

In order to completely eliminate variation in size of the contact hole caused by varied thicknesses of the BPSG film 2, it would be necessary to reduce exposure lights transmitting through the first TiN film 3. In this respect, it is necessary for the first TiN film 3 to have a thickness equal to or greater than 25 nm.

Second Embodiment

FIGS. 3A to 3F illustrate respective steps of a method of fabricating a semiconductor device in accordance with the second embodiment of the invention.

Figure 3A:
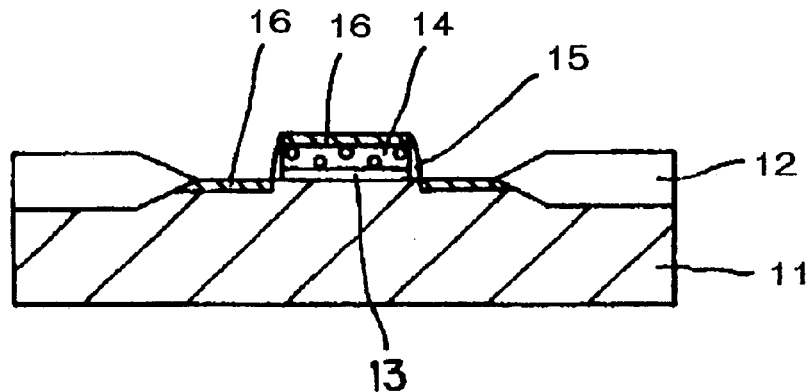
FIGS. 3A to 3F are cross-sectional views of a semiconductor device, illustrating respective steps of a method of fabricating a semiconductor device, in accordance with the second embodiment of the invention.

A thin silicon dioxide film 13 which will act as a gate oxide film is formed on a silicon substrate 11 in an area defined by silicon dioxide films 12 therebetween. A polysilicon film 14 which will act as a gate electrode is formed on the silicon dioxide film 13. Then, a sidewall 15 made of a silicon dioxide film is formed surrounding a side surface of the polysilicon film 14. Then, a Ti film is formed by sputtering, followed by annealing at 600 to 800° C. for 30 to 60 seconds to thereby form a Ti silicide film 16 in areas where the silicon substrate 11 makes contact with the Ti film and where the silicon substrate 11 makes contact with the polysilicon film 14. The Ti film having not turned to a silicide is not removed by means of aqueous solution of ammonia and hydrogen peroxide. Thus, there is formed a transistor having a salicide structure, as illustrated in FIG. 3A.

Figure 3B:
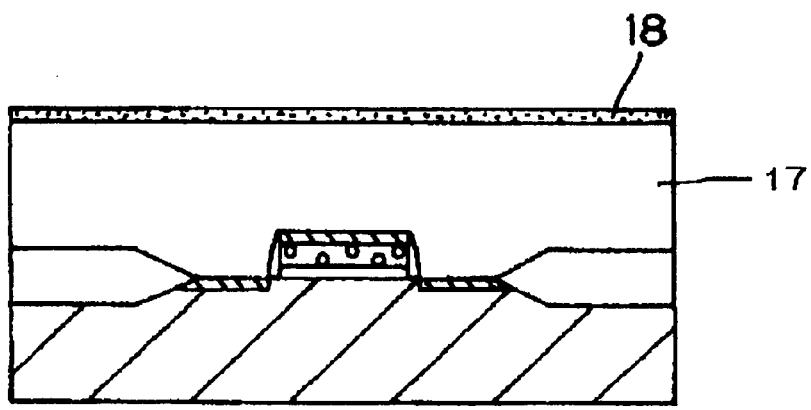

Then, a boron phospho silicate glass film 17 is deposited over a resultant by CVD by a thickness of about 1.5 $\mu$m. Then, a first TiN film 18 is formed all over the BPSG film 17 by sputtering by a thickness of about 30 nm, as illustrated in FIG. 3B. The first TiN film 18 may be formed after later mentioned contact holes have been formed.

Figure 3C:
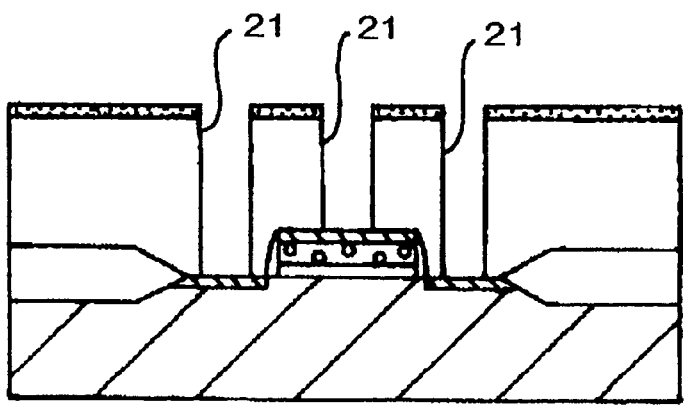

Then, similarly to the first embodiment, a plurality of contact holes 21 at desired locations throughout the first TiN film 18 and the BPSG film 17 by photolithography and dry etching, as illustrated in FIG. 3C. As illustrated, the contact holes 21 reach the Ti silicide film 16.

Figure 3D:
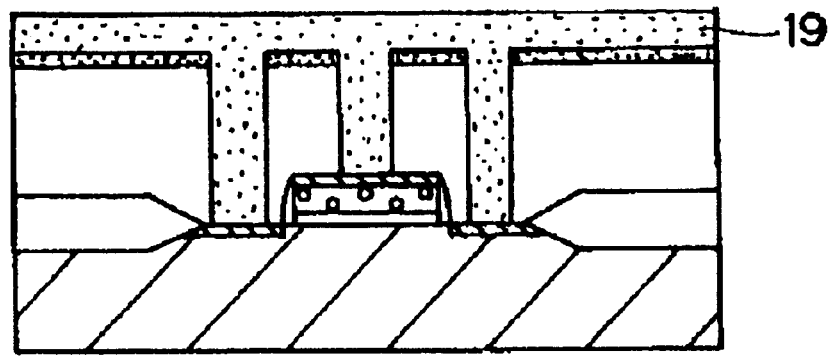

Then, a second TiN film 19 is formed all over a resultant by a thickness in the range of 0.2 to 0.3 $\mu$m by thermal CVD employing TiCl$_4$, NH$_3$ and N$_2$ gases. As a result, the contact holes 21 are filled with the second TiN film 19, as illustrated in FIG. 3D.

Figure 3E:
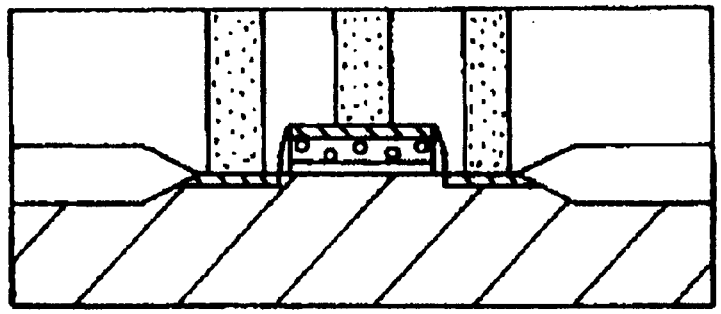

Then, the second TiN film 19 and the first TiN film 18 are etched by reactive ion etching (RIE) employing a chlorine family gas such as Cl$_2$ gas, until an upper surface of the BPSG film 17 appears. As a result, the contact holes 21 are filled only with the second TiN film 19, as illustrated in FIG. 3E.

Figure 3F:
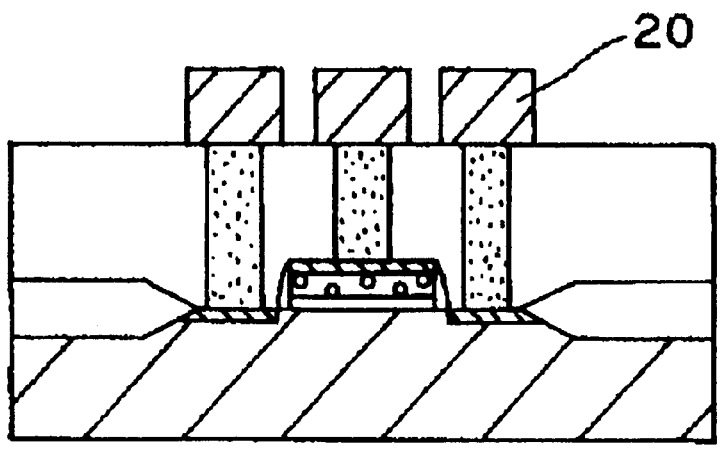

Then, an aluminum alloy film 20 is deposited all over the BPSG film 17 by sputtering. The thus deposited aluminum alloy film 20 is patterned into a desired pattern by conventional photolithography and dry etching. Thus, an aluminum wiring layer is completed, as illustrated in FIG. 3F.

In accordance with the above-mentioned second embodiment, since the Ti silicide film 16 is formed at a bottom of the contact holes 21, it is not necessary to form a Ti film before the second TiN film 19 is formed by CVD. Since a Ti film does not have so good step coverage in a contact hole as step coverage of a TiN film formed by CVD, even if formed by plasma-enhanced CVD, it would be quite difficult to fill a contact hole having an aspect ratio equal to or higher than six (6) with a CVD-TiN film after the formation of a Ti film. In contrast, when a contact hole is filled only with a TiN film formed by thermal CVD having excellent step coverage, a high aspect ratio contact hole such as one having an aspect ratio equal to or higher than six could be readily filled with a TiN film.

Third Embodiment

Figure 4:
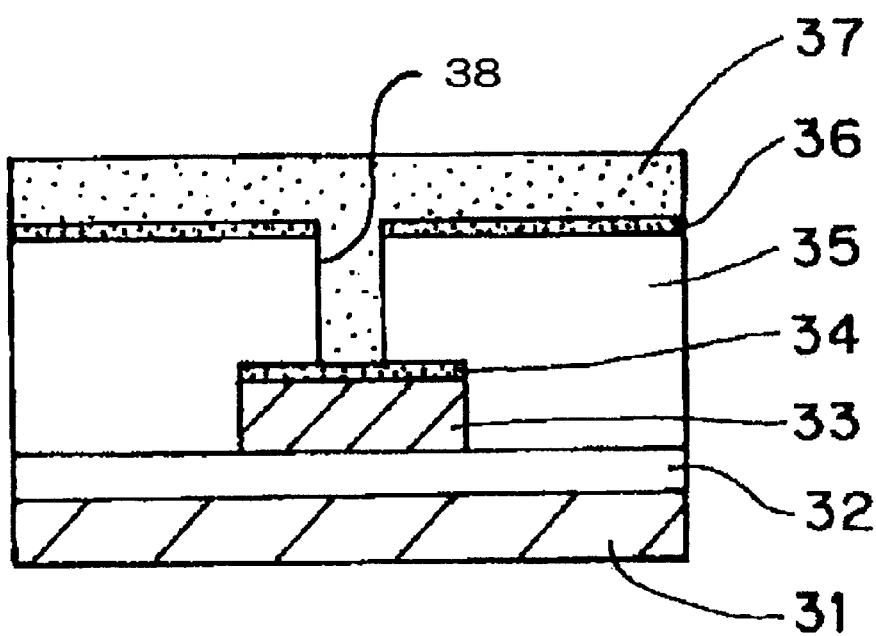
FIG. 4 is a cross-sectional view of a semiconductor device, illustrating a step of a method of fabricating a semiconductor device, in accordance with the third embodiment of the invention.

FIG. 4 illustrates a semiconductor device in accordance with the third embodiment. This embodiment exemplifies a case where a through-hole is formed above a wiring layer composed of an aluminum alloy film and a TiN film, and does not need to have a Ti film under the second TiN film.

A silicon dioxide film 32 is formed on a silicon substrate 31 on which devices have been already fabricated. Then, an aluminum alloy film 33 is formed all over the silicon dioxide film 32 by sputtering by a thickness of 0.5 $\mu$m, and a third TiN film 34 is formed over the aluminum alloy film 33 by sputtering by a thickness in the range of 25 nm to 50 nm. Then, the aluminum alloy film 33 and the third TiN film 34 are patterned by photolithography and dry etching to thereby form a lower wiring layer.

Then, a silicon dioxide film 35 is deposited by CVD by a thickness of 1.0 $\mu$m, and a first TiN film 36 is deposited all over the silicon dioxide film 35 by sputtering by a thickness of about 30 nm. Then, the first TiN film 36 and the silicon dioxide film 35 are removed in a selected area by photolithography and dry etching to thereby form an about 0.25 $\mu$m-diameter through-hole 38 throughout the first TiN film 36 and the silicon dioxide film 35, by which an upper surface of the third TiN film 34 is exposed. The first TiN film 36 may be formed after the through-hole 38 has been formed.

Then, there is formed a second TiN film 37 by a thickness in the range of 0.2 to 0.3 $\mu$m by thermal CVD employing TiCl$_4$, NH$_3$ and N$_2$ gases, to thereby fill the through-hole 38 with the second TiN film 37. A semiconductor device at this stage is illustrated in FIG. 4.

Then, the second TiN film 37 and the first TiN film 36 are etched until an upper surface of the silicon dioxide film 35 appears. At this stage, the through-hole 38 is filled only with the second TiN film 37. Then, aluminum is deposited all over a resultant, and is patterned into a desired pattern to thereby form an upper wiring layer (not illustrated).

In the above-mentioned third embodiment, the TiN film 34 is formed on the aluminum alloy film 33. However, it should be noted that there may be formed a refractory metal film such as a film made of W, TiW or W silicide, a refractory metal alloy film, or a refractory metal silicide film on the aluminum alloy film 33 in place of the third TiN film 34. As an alternative, a layer made of single material such as refractory metal and so on may be formed in place of a layered structure of the aluminum alloy layer 33 and the third TiN film 34. As an electrically conductive film making contact with a bottom of the contact hole 38, there may be formed a film made of metal such as copper and gold in place of the third TiN film 34. A through-hole reaching a wiring layer made of copper or gold may be filled only with a TiN film formed by CVD.

Fourth Embodiment

FIGS. 5A to 5D illustrate respective steps of a method of fabricating a semiconductor device in accordance with the fourth embodiment of the invention. In the fourth embodiment, there is formed a capacitive electrode made of a TiN film formed by CVD.

First, a silicon dioxide film 43 is formed on a surface of a p-type silicon substrate 41 for forming device formation regions therebetween. Then, a gate oxide film 40 is formed on the silicon substrate 41, and a gate electrode 44 is formed on the gate oxide film 40. Then, n-type impurities are implanted into the silicon substrate 41 with the gate electrode 44 acting as a mask to thereby define $n^+$ diffusion layers 42 within the device formation region.

Figure 5A:
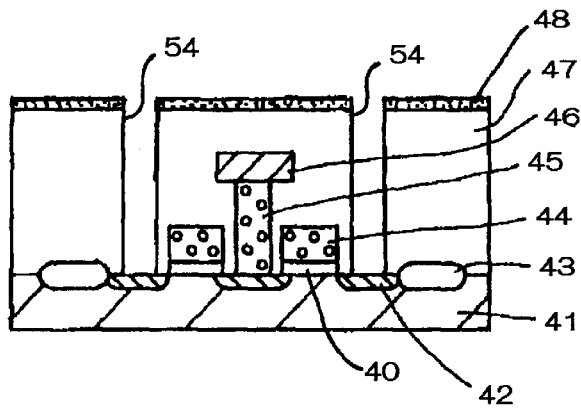
FIGS. 5A to 5D are cross-sectional views of a semiconductor device, illustrating respective steps of a method of fabricating a semiconductor device, in accordance with the fourth embodiment of the invention.

Thereafter, a bit line 46 made of tungsten silicide is formed in connection with one of the $n^+$ diffusion layers 42 through a polysilicon plug 45. Then, a silicon dioxide film 47 made of BPSG is formed by CVD to thereby cover a resultant therewith. Then, a first TiN film 48 is formed all over the BPSG film 47 by sputtering by a thickness in the range of 30 nm to 50 nm. Similarly to the previously mentioned embodiments, there are formed about 0.2 $\mu$m-diameter contact holes 54 at desired locations throughout the first TiN film 48 and the silicon dioxide film 47 by photolithography and dry etching, as illustrated in FIG. 5A. The contact holes 54 reach an upper surface of the $n^+$ diffusion layers 42. The first TiN film 48 may be formed after the contact holes 54 have been formed.

Figure 5B:
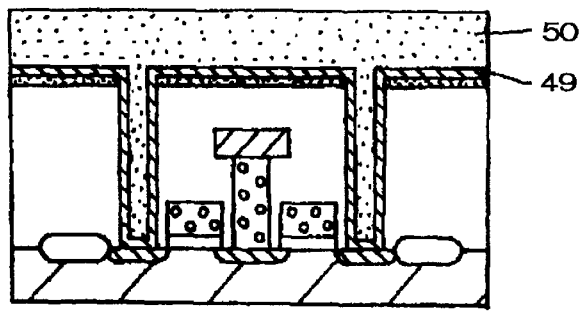

Then, a Ti film 49 is formed all over a resultant by plasma-enhanced CVD by a thickness in the range of 10 nm to 30 nm, and further a second TiN film 50 is formed over the first TiN film 49 by thermal CVD by a thickness in the range of 0.6 to 1.0 $\mu$m, as illustrated in FIG. 5B. The conditions for the formation of the Ti film 49 and the second TiN film 50 are the same as those in the first embodiment.

Figure 5C:
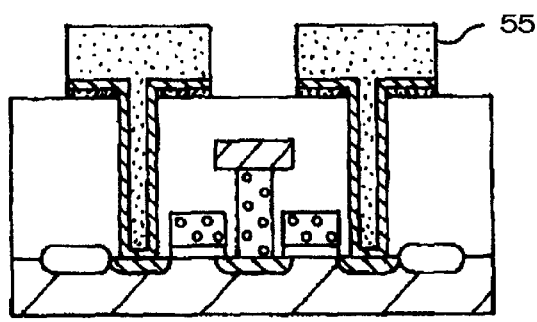

Then, the second TiN film 50, the Ti film 49 and the first TiN film 48 are patterned into a desired pattern by conventional photolithography and dry etching to thereby form capacitive lower electrodes 55, as illustrated in FIG. 5C.

Then, a tantalum oxide ($Ta_2O_5$) film 51, a third TiN film 52 and a tungsten silicide film 53 are formed in this order over a resultant by thicknesses of 10, 100 and 100 nm, respectively. For instance, the tantalum oxide film 51 may be formed by CVD at 1 Torr at substrate temperature of 450° C. with ethoxytantalum and oxygen employed as process gases. The third TiN film 52 and the tungsten silicide film 53 may be formed by sputtering, for instance.

Figure 5D:
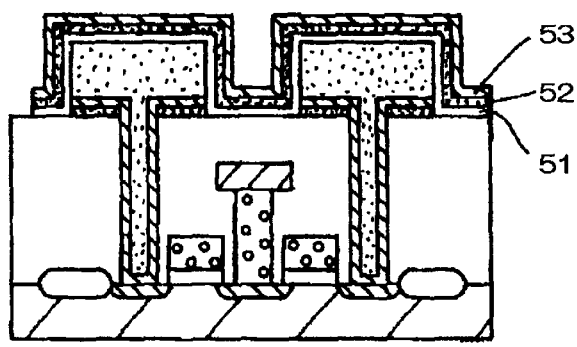

Thereafter, the tungsten silicide film 53, the third TiN film 52, and the tantalum oxide ($Ta_2O_5$) film 51 are patterned by photolithography and dry etching to thereby form cell plate electrodes, as illustrated in FIG. 5D.

In the above-mentioned fourth embodiment, the thick second TiN film 51 and the Ti film 49, both of which are formed by CVD, and the first TiN film 48 are patterned into a desired pattern to thereby form capacitive lower electrodes. There does not cause a problem that electrodes are peeled off, even if they are formed in a fine pattern such as a 0.2 $\mu$m×0.4 $\mu$m-size pattern, because the first TiN film 48 has excellent adhesion with an interlayer insulating layer.

As an alternative to the capacitive lower electrodes, there may be formed a wiring layer of the TiN film.

In the fourth embodiment, the first TiN film 48, a TiN film to be formed on an interlayer insulating film, is formed by sputtering. There may be formed a Ti or TiW film by sputtering as a film having excellent adhesion with the silicon dioxide film 47 in place of the first TiN film 48, however, in which case, $TiCl_4$ from which the second TiN film 50 is made reacts with Ti or TiW, resulting in poor adhesion between the Ti or TiW film and the second TiN film 50 formed by CVD. This may cause that the CVD-TiN film 50 may be peeled off. Hence, a TiN film formed by sputtering is most suitable for the first TiN film 48.

Fifth Embodiment

Figure 6A:
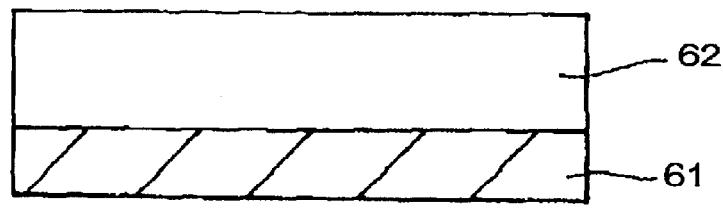
FIGS. 6A to 6E are cross-sectional views of a semiconductor device, illustrating respective steps of a method of fabricating a semiconductor device, in accordance with the fifth embodiment of the invention.

FIGS. 6A to 6E illustrate a method of fabricating a semiconductor device in accordance with the fifth embodiment of the invention. A boron phospho silicate glass (BPSG) film 62 as an interlayer insulating film is formed on a silicon substrate 61, on which devices have already been fabricated, by CVD by a thickness of about 1.5 $\mu$m, as illustrated in FIG. 6A.

Figure 6B:
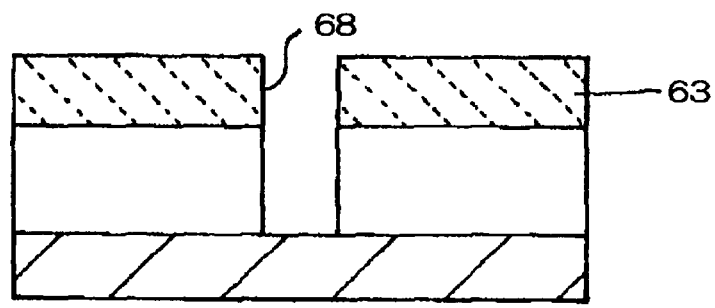

Then, after a photoresist film 63 has been applied over the BPSG film 62, there is formed an about 0.3 $\mu$m-diameter hole at a desired location throughout the photoresist film 63 by exposure and development. Then, the BPSG film 62 is dry etched by employing a mixture gas of trifluorochloromethane ($CHF_3$) and carbon monoxide (CO) gases with the photoresist film 63 used as a mask, until the silicon substrate 61 appears. Thus, a contact hole 68 is formed throughout the photoresist film 63 and BPSG film 62, as illustrated in FIG. 6B.

After the photoresist film 63 has been removed, a first Ti film 64 is formed over a resultant by sputtering by a thickness of 10 nm. It should be noted that the first Ti film 64 is formed only on the BPSG film 62, and is scarcely formed within the contact hole 68. The first Ti film 64 may be formed before the contact hole 68 is formed.

Figure 6C:
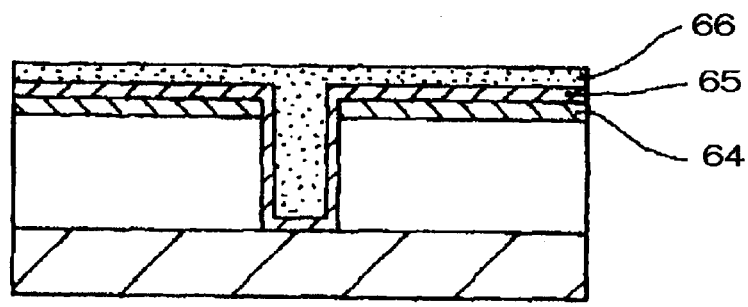

Then, a second Ti film 65 and a TiN film 66 are formed in this order by CVD to thereby fill the contact hole 68 with the second Ti film 65 and the TiN film 66, as illustrated in FIG. 6C. The second Ti film 65 is formed by a thickness in the range of 10 to 30 nm by plasma-enhanced CVD under the following conditions.

$TiCl_4$ flow rate: 3 to 10 sccm

Ar flow rate: 200 to 500 sccm $H_2$ flow rate: 1000 to 2000 sccm

Pressure: 3 to 10 Torr.

Substrate Temperature: 400 to 500° C.

RF power applied to opposing electrodes of a substrate: multiple hundreds W

The TiN film 66 is formed by a thickness in the range of 0.2 to 0.3 $\mu$m by thermal CVD under the following conditions.

$TiCl_4$ flow rate: 30 to 50 sccm $NH_3$ flow rate: 40 to 70 sccm $N_2$ flow rate: 30 to 50 sccm Pressure: 15 to 30 Torr.

Substrate Temperature: 400 to 500° C.

The contact hole 68 may be filled only with the second Ti film 65 in place of both the second Ti film 65 and the TiN film 66.

Figure 6D:
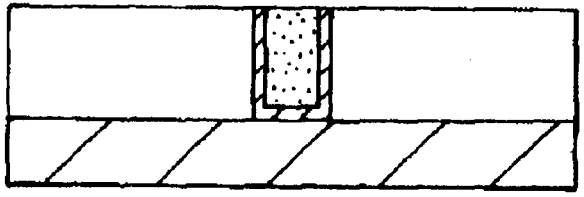

Then, a resultant is etched by using chlorine ($Cl_2$) gas to thereby remove the TiN film 66, the second Ti film 65, and the first Ti film 64 situated higher than an upper surface of the BPSG film 62. Thus, an upper surface of the BPSG film 62 appears, and only the contact hole 68 is filled with the second Ti film 65 and the TiN film 66, as illustrated in FIG. 6D.

Figure 6E:
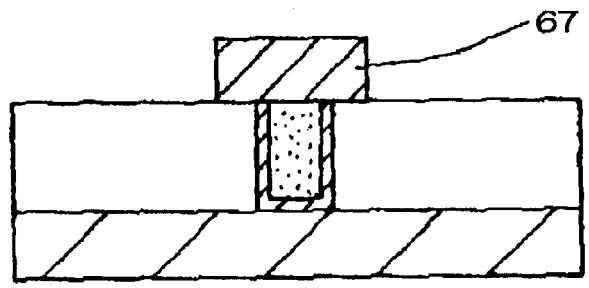

Then, an aluminum alloy film 67 is deposited by sputtering by a thickness in the range of 0.3 to 1.0 $\mu$m. The thus deposited aluminum alloy film 67 is patterned into a desired pattern by conventional photolithography and dry etching. Thus, an aluminum wiring layer is completed, as illustrated in FIG. 6E.

As an alternative to the formation of the aluminum wiring layer, there may be formed a wiring layer by patterning the TiN film 66, the second Ti film 65 and the first Ti film 64. Alternatively, there may be formed a capacitive lower electrode by forming the second Ti film 65 and the TiN film 66 thicker in the same manner as the fourth embodiment.

The above-mentioned fifth embodiment presents advantages as follows.

Since the first Ti film 64 is formed by sputtering, the first Ti film 64 has more excellent adhesion with the BPSG film 62 as an interlayer insulating film than a Ti film formed by CVD. Thus, even if the first Ti film 64, and the second Ti film 65 and the TiN film 66 both of which are formed by CVD on the first Ti film 64 were formed at temperature equal to or below 500° C., the first Ti film 64 never peels off. Accordingly, it is possible to fill the contact hole 68 with the second Ti film 65 having excellent step coverage without an interlayer insulating film such as the silicon dioxide film 62 being peeled off.

With respect to a thickness of the first Ti film 64, if the first Ti film 64 has a thickness smaller than 5 nm, the first Ti film 64 may be etched by a $TiCl_4$ gas at an initial stage for forming the second Ti film 65, resulting in that the silicon dioxide or BPSG film 62 is caused to be exposed outside. Thereafter, the second Ti film 65 is formed. Thus, the first Ti film 64 provides only poor adhesion with the BPSG film 62, and thus the first Ti film 64 may be peeled off the BPSG film 62. Hence, it is necessary for the first Ti film 64 to have a thickness equal to or greater than 5 nm.

In addition, the first Ti film 64 has poor step coverage, and hence the first Ti film 64 is not useful for filling the contact hole 68 therewith, even when the first Ti film 64 was formed after the contact hole 68 has been formed. Even if the first Ti film 64 is formed thick, it result only in that what is to be etched back merely increases. Thus, it is preferable that the first Ti film 64 has a thickness equal to or smaller than 50 nm.

Sixth Embodiment

Figure 7:
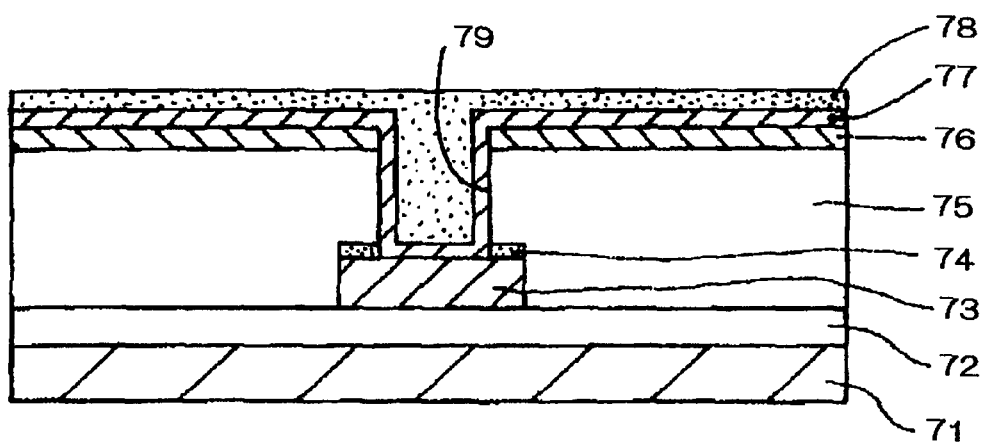
FIG. 7 is a cross-sectional view of a semiconductor device, illustrating a step of a method of fabricating a semiconductor device, in accordance with the sixth embodiment of the invention.

FIG. 7 illustrates one of steps of a method of fabricating a semiconductor device in accordance with the sixth embodiment. In the instant embodiment, when a through-hole is formed above a wiring layer composed of an aluminum alloy film and a TiN film, the through-hole is formed to reach the aluminum alloy film formed below the TiN film for simplification of etching process. It is necessary in the instant embodiment to form a Ti film under a TiN film with which a through-hole is filled.

A silicon dioxide film 72 is formed on a silicon substrate 71 on which devices have been already fabricated. Then, an aluminum alloy film 73 is formed all over the silicon dioxide film 72 by sputtering by a thickness of 0.5 $\mu$m, and a TiN film 74 is formed over the aluminum alloy film 73 by sputtering by a thickness in the range of 25 nm to 50 nm.

Then, the aluminum alloy film 73 and the TiN film 74 are patterned by photolithography and dry etching to thereby form a lower wiring layer.

Then, a silicon dioxide film 75 is deposited by CVD by a thickness of 1.0 $\mu$m. Then, the silicon dioxide film 75 is removed in a selected area by photolithography and dry etching to thereby form an about 0.25 $\mu$m-diameter through-hole 79 throughout the silicon dioxide film 75 and the TiN film 74, by which an upper surface of the aluminum alloy film 73 is exposed. Then, a first Ti film 76 is formed over a resultant by sputtering by a thickness of 10 nm. The first Ti film 76 is formed only on the silicon dioxide film 75, and is not formed within the through-hole 79.

Then, there is formed a second Ti film 77 by plasma-enhanced CVD at 450° C., employing $TiCl_4$, $H_2$ and Ar gases, by a thickness in the range of 5 to 20 nm. Subsequently, there is formed a TiN film 78 over the Ti film 77 by thermal CVD employing $TiCl_4$, $NH_3$ and $N_2$ gases, by a thickness in the range of 0.2 to 0.3 $\mu$m, to thereby fill the through-hole 79 with the second Ti film 77 and the TiN film 78. A semiconductor device at this stage is illustrated in FIG. 7.

Then, the TiN film 78, the second Ti film 77 and the first Ti film 76 are etched until an upper surface of the silicon dioxide film 75 appears. At this stage, the through-hole 38 is filled with the second Ti film 77 and the TiN film 78. Then, an aluminum alloy film is formed all over a resultant, and is patterned into a desired pattern to thereby form an upper wiring layer (not illustrated).

Since a Ti film formed by CVD has more excellent step coverage than that of a Ti film formed by sputtering, it is possible for a sufficiently thin Ti film to provide a good contact even for a high aspect ratio through-hole such as a through-hole having an aspect ratio greater than 4.

As having been explained in connection with the preferred embodiments, in the method in accordance with the invention, after a TiN and/or Ti film(s) have (has) been formed by sputtering on an interlayer insulating film, a contact hole is filled with TiN and Ti films formed by CVD. Since the TiN film formed by sputtering has excellent adhesion with an interlayer insulating film such as a silicon dioxide film, and has a compressive stress acting thereon, the TiN film can prevent the CVD-TiN film from being cracked or peeled off, even if the CVD-TiN film in which a tensile force acts thereon is formed thick.

In addition, since a Ti film formed by sputtering has high adhesion with a silicon dioxide film, even if a CVD-TiN film having high step coverage was formed on the Ti film, it would be possible to prevent the CVD-TiN film from being cracked or peeled off.

Thus, in accordance with the present invention, it is possible to fill a contact hole with low-resistive CVD-TiN and Ti films having excellent step coverage, even if the contact hole had a high aspect ratio. In addition, since CVD-TiN and Ti films could be formed thick, it would be possible to form a capacitive lower electrode and/or a wiring layer of the CVD-TiN and Ti films. Furthermore, since it is now possible to prevent TiN and Ti films from being cracked and peeled off, a fabrication yield as well as reliability to devices can be enhanced.

In accordance with the method where TiN and Ti films are formed by sputtering prior to the formation of TiN and Ti films on an interlayer insulating film by CVD, even if the CVD-TiN and Ti films were formed at low temperature, it would be possible to cause the CVD-TiN and Ti films to have high adhesion with the interlayer insulating film, resulting in that the CVD-TiN and Ti films can be prevented from being cracked. It would be also possible to prevent a capacitive insulating film having low heat resistance and made of material such as tantalum oxide from being degraded by utilizing the above-mentioned method.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Applications Nos. 8-111392 and 9-16191 filed on May 2, 1996 and Jan. 30, 1997, respectively, each including specification, claims, drawings and summary are incorporated herein by reference in its entirety.

What is claimed is:

1. A method of fabricating a semiconductor comprising the steps of:
   (a) forming an interlayer insulating film on a semiconductor substrate;
   (b) forming a first TiN film on said interlayer insulating film by sputtering;
   (c) forming a hole throughout said interlayer insulating film to thereby cause said semiconductor substrate to appear;
   (d) forming a Ti film contacting a resultant by chemical vapor deposition;
   (e) forming a second TiN film contacting said Ti film by chemical vapor deposition to thereby fill said hole with said second TiN film; and
   (f) removing said first and second TiN films except for the TiN filling said hole therewith,
   one of steps (b) and (c) being carried out immediately subsequent to step (a); and steps (d) and (e) being carried out in this order after steps (b) and (c).

2. The method as set forth in claim 1, wherein said steps are carried out in the order of (a), (c), (b), (d), (e) and (f).

3. The method as set forth in claim 1, wherein an electrically conductive layer is formed on said semiconductor substrate, said hole being formed to cause said electrically conductive layer to appear in said step (c).

4. The method as set forth in claim 3, wherein at least a surface of said electrically conductive layer is made of one of refractory metal, refractory metal alloy, refractory metal silicide, refractory metal nitride, and low-resistive metal.

5. The method as set forth in claim 1, wherein said sputtering is carried out in said step (b) so that compressive stress is generated in said first TiN film.

6. The method as set forth in claim 1, wherein said first TiN film has a thickness in the range of 25 nm to 50 nm both inclusive.

7. The method as set forth in claim 1, wherein said second TiN film has a thickness in the range of 0.2 $\mu$m to 0.3 $\mu$m both inclusive.

8. The method as set forth in claim 1 further comprising the step of (g) forming a wiring layer on said interlayer insulating film, said step (g) being carried out subsequently to said step (f).

9. The method as set forth in claim 1, wherein said first and second TiN films are etched in a selected area in said step (f) to thereby form a capacitive lower electrode or a wiring layer composed of said first and second TiN films and said Ti film.

10. The method as set forth in claim 1, wherein said second TiN film is formed in said step (d) at a temperature equal to or below 500° C.

11. A method of fabricating a semiconductor comprising the steps of:
   (a) forming an interlayer insulating film on a semiconductor substrate;
   (b) forming a first Ti film on said interlayer insulating film by sputtering;
   (c) forming a hole throughout said interlayer insulating film to thereby cause said semiconductor substrate to appear;
   (d) forming a second Ti film contacting said first Ti film and a TiN film over a resultant by chemical vapor deposition to thereby fill said hole with said second Ti film and said TiN film; and
   (e) removing said first and second Ti films and said TiN film except for the Ti and TiN filling said hole therewith,
   one of steps (b) and (c) being carried out immediately subsequent to step (a); and steps (d) and (e) being carried out in this order after steps (b) and (c).

12. The method as set forth in claim 11, wherein said steps are carried out in the order of (a), (c), (b), (d), and (e).

13. The method as set forth in claim 11, wherein an electrically conductive layer is formed on said semiconductor substrate, said hole being formed to cause said electrically conductive layer to appear in said step (c).

14. The method as set forth in claim 13, wherein at least a surface of said electrically conductive layer is made of one of refractory metal, refractory metal alloy, refractory metal silicide, refractory metal nitride, and low-resistive metal.

15. The method as set forth in claim 11 further comprising the step of (f) forming a wiring layer on said interlayer insulating film, said step (f) being carried out subsequently to said step (e).

16. The method as set forth in claim 11, wherein said first and second Ti films are etched in a selected area in said step (e) to thereby form a capacitive lower electrode or a wiring layer composed of said first and second Ti films.

17. The method as set forth in claim 11, wherein said second Ti film is formed in said step (d) at a temperature equal to or below 500° C.

18. The method as set forth in claim 11, wherein said first Ti film has a thickness in the range of 5 nm to 50 nm both inclusive.

19. The method as set forth in claim 11, wherein said second Ti film is formed in said step (d) by reducing $TiCl_4$.

20. The method as set forth in claim 1, wherein said steps are carried out in the order of (a), (b), (c), (d), (e) and (f).

21. The method as set forth in claim 11, wherein said steps are carried out in the order of (a), (b), (c), (d) and (e).

* * * * *